(12) United States Patent
Duwel et al.

(10) Patent No.: US 7,924,049 B1
(45) Date of Patent: Apr. 12, 2011

(54) ACCELERATED PROGRAMMING TECHNIQUE FOR INTEGRATED CIRCUITS

(75) Inventors: Keith Duwel, Danville, CA (US); Balaji Margabandu, Santa Clara, CA (US); Dirk A. Reese, Campbell, CA (US); Leo Min Maung, Fremont, CA (US)

(73) Assignee: Altera Corporation, San Jose, CA (US)

( * ) Notice: Subject to any disclaimer, the term of this patent is extended or adjusted under 35 U.S.C. 154(b) by 229 days.

(21) Appl. No.: 11/960,520

(22) Filed: Dec. 19, 2007

(51) Int. Cl.
*H03K 19/173* (2006.01)

(52) U.S. Cl. ......... 326/38; 326/93; 326/95; 365/189.05; 365/233.1

(58) Field of Classification Search .............. 326/37–41, 326/93–95; 327/234, 238; 365/193, 233.5, 365/194, 189.08, 191, 233; 716/16
See application file for complete search history.

(56) References Cited

U.S. PATENT DOCUMENTS

| | | | | |
|---|---|---|---|---|
| 5,978,281 A * | 11/1999 | Anand et al. | ............. | 365/189.05 |
| 6,466,491 B2 * | 10/2002 | Yanagawa | ..................... | 365/194 |
| 6,603,706 B1 * | 8/2003 | Nystuen et al. | ............ | 365/233.1 |
| 6,734,703 B1 * | 5/2004 | Alfke et al. | ...................... | 326/38 |
| 6,894,531 B1 * | 5/2005 | Nouban et al. | .................. | 326/38 |
| 7,202,714 B2 * | 4/2007 | Park | .............................. | 327/149 |
| 7,342,838 B1 * | 3/2008 | Sharpe-Geisler et al. | .... | 365/193 |
| 7,437,500 B2 * | 10/2008 | Butt et al. | ..................... | 711/105 |

* cited by examiner

*Primary Examiner* — James H. Cho
*Assistant Examiner* — Christopher Lo
(74) *Attorney, Agent, or Firm* — Martine Penilla & Gencarella, LLP

(57) ABSTRACT

Provided is a method and system to transmit data to a configurable integrated circuit that features delaying a capture edge of a clock signal at a data latch to synchronize the receipt of data at the data latch that was transmitted in response to a storage device receiving a launch edge of the clock signal. The method includes transmitting the clock signal having the launch edge and the capture edge to the storage device. The data is launched from the storage device to the integrated circuit in response to the storage device sensing the launch edge. Receipt of the capture edge at the data latch is delayed for a predetermined time to compensate for a delay between transmitting the launch edge and launching the data to ensure the data is latched by the data latch. Also disclosed is a system that carries out the function of the method.

20 Claims, 5 Drawing Sheets

ACCELERATED PROGRAMMING TECHNIQUE FOR INTEGRATED CIRCUITS

BACKGROUND

Programmable logic devices, such as field programmable gate arrays (FPGAs) are digital logic circuits that can be programmed to perform a variety of logical functions. A specific logical function is programmed into a programmable logic device by a user. A user may subsequently overwrite the initial logical function with a new logical function. To that end, FPGAs include an array of programmable logic blocks in data communication with input/output (I/O) circuitry. I/O pads are in data communication with the I/O circuitry to place the same in data communication with external circuitry. The I/O circuitry functions as an interface with the external circuitry to route signals appropriately to different circuits within the FPGA.

One technique to program an FPGA includes a storage device external to the FPGA and in data communication therewith. The storage device typically has sufficient capacity to store information that facilitates configuration of the logic blocks and additional configuration data, such as user-specific configuration data. The precise capacity required for the storage device is dependent, in part, upon the particular FPGA employed. An example of an FPGA includes the families of devices owned and sold by the assignee. Typically, the storage device for the configuration is an industry-standard Flash memory. It has been observed that the time required to configure the FPGA with information from the storage device upon intialization is increased due to the delay presented by I/O circuitry and the speed at which the data is accessed from the storage device.

The speed that data can be synchronously read from an external memory is limited by the time it takes to generate a clock signal, to send the clock signal to the memory, for the memory to transmit the data and for the sender to capture the data. Currently, the limitations on the configuration time for programmable logic devices discourages customers away from FPGAs and towards application specific integrated circuits in certain instances.

Thus, there is a need for improved performance when configuring FPGAs.

SUMMARY OF THE INVENTION

The embodiments described below provide techniques to enhance the configuration of a programmable logic device having a synchronous design. It should be appreciated that the present invention can be implemented in numerous ways, such as a process, an apparatus, a system, a device or a method on a computer readable medium. Several inventive embodiments of the present invention are described below.

Provided is a method and system to transmit data to a configurable integrated circuit that features delaying a capture edge of a clock signal at a data latch to synchronize the receipt of data at the data latch that was transmitted in response to a storage device receiving a launch edge of the clock signal. To that end, the method includes transmitting the clock signal having consecutive edges to the storage device. The storage device contains configuration data to configure the integrated circuit. The data is launched from the storage device to the integrated circuit in response to the storage device sensing the launch edge. Receipt of the capture edge at the data latch is delayed for a predetermined time to compensate for a delay between transmitting the launch edge and capturing the data to ensure the data is captured by the data latch. Also disclosed is a system that carries out the function of the method. Theses and other embodiments of the present invention are described more fully below.

Other aspects and advantages of the invention will become more apparent from the following detailed description, taken in conjunction with the accompanying drawings, illustrating by way of example the present invention.

BRIEF DESCRIPTION OF THE DRAWINGS

The present invention can be best understood by reference to the following description taken in conjunction with the accompanying figures, in which like parts may be referred with like numerals.

DETAILED DESCRIPTION OF THE INVENTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The embodiments described herein provide for a method and system for transmitting data into a configurable integrated circuit for a synchronous design. In one embodiment, the same logical clock that is output to the storage device storing the configuration, e.g., a flash memory or other suitable non-volatile memory, is purposefully delayed to the storage elements, e.g., flip-flops, latches, registers, etc., that capture the returning data. The embodiments provide that the added delay is less than the minimum amount of time it takes for the data to be presented at the capture storage element. The technique described herein essentially borrows time from the next clock cycle. Accordingly, the FPGA configuration clock period is the amount of time it takes to receive data from the storage device minus the time borrowed from the next cycle, thereby resulting in a faster configuration speed. It should be appreciated that the embodiments described herein embed delay cells that allow the same clock edge to both clock the storage device for data and clock the data into a capture storage element.

Figure 1:
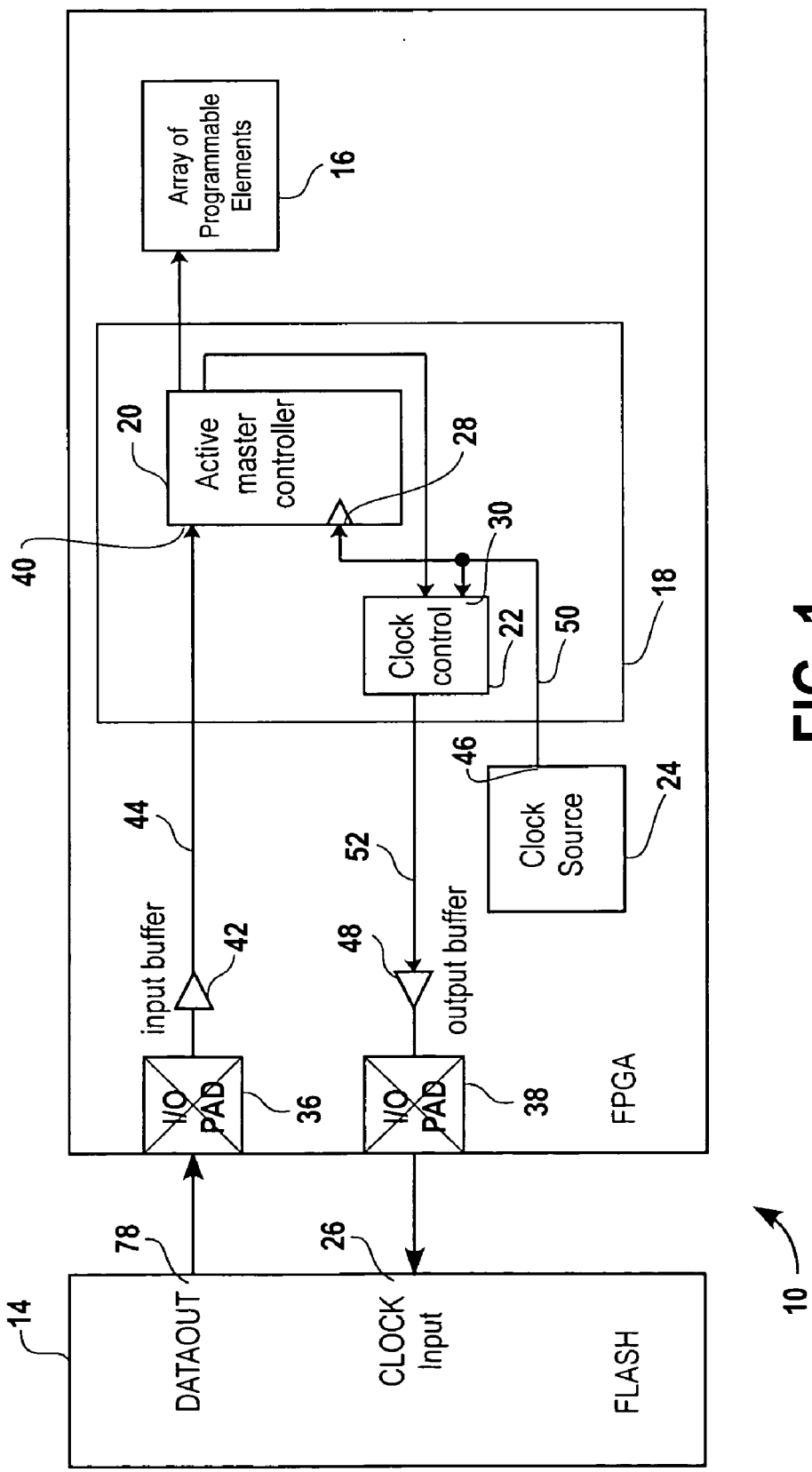
FIG. 1 is a simplified schematic view of a system for transmitting data to a configurable integrated circuit.

Referring to FIG. 1, system 10 includes an integrated circuit 12 in data communication with a storage device 14. Storage device is typically an industry-standard Flash memory. Integrated circuit 10 may be any known integrated circuit 12 in the art but the present example of integrated circuit is a programmable logic device, such as a Field Programmable Gate Array (FPGA) available from the assignee. To that end, FPGA 12 includes an array of programmable elements 16, control circuitry 18 in electrical communication with array 16. Control circuitry 18 includes an active master controller (AMC) 20 and a clock control circuit (CCC) 22 in communication with AMC 20. CCC 22 controls the clock signal from clock source 24 to storage device 14. Clock source 24 provides a clock input 28 of AMC 20 and a clock input 30 of CCC 22. A clock output 46 of clock source 24 is in signal communication with a clock input 26 of storage device 14 through CCC 22, output buffer 48, and I/O pad 38. FPGA 12 includes a plurality of input/output pads shown as input pad 36 and output pad 38. A data path is defined between input pad 36 and a data input 40 of AMC 20 that includes multiple circuit elements, shown generally as input buffer 42, and signal wires (also referred to as traces), shown generally by wire 44. A clock path is defined between clock output 46 of clock source 24 and output pad 38. As a result, the clock path includes multiple circuit elements, shown generally as buffer 48 and CCC 22 and multiple signal wires, shown generally by wires 50 and 52. In one embodiment AMC 20 may be thought of as a state machine that enables the clock signal to flow through or to not flow through. One skilled in the art will appreciate that AMC 20 programs the logical elements of the programmable logic device which are not depicted for illustrative purposes.

Figure 2:
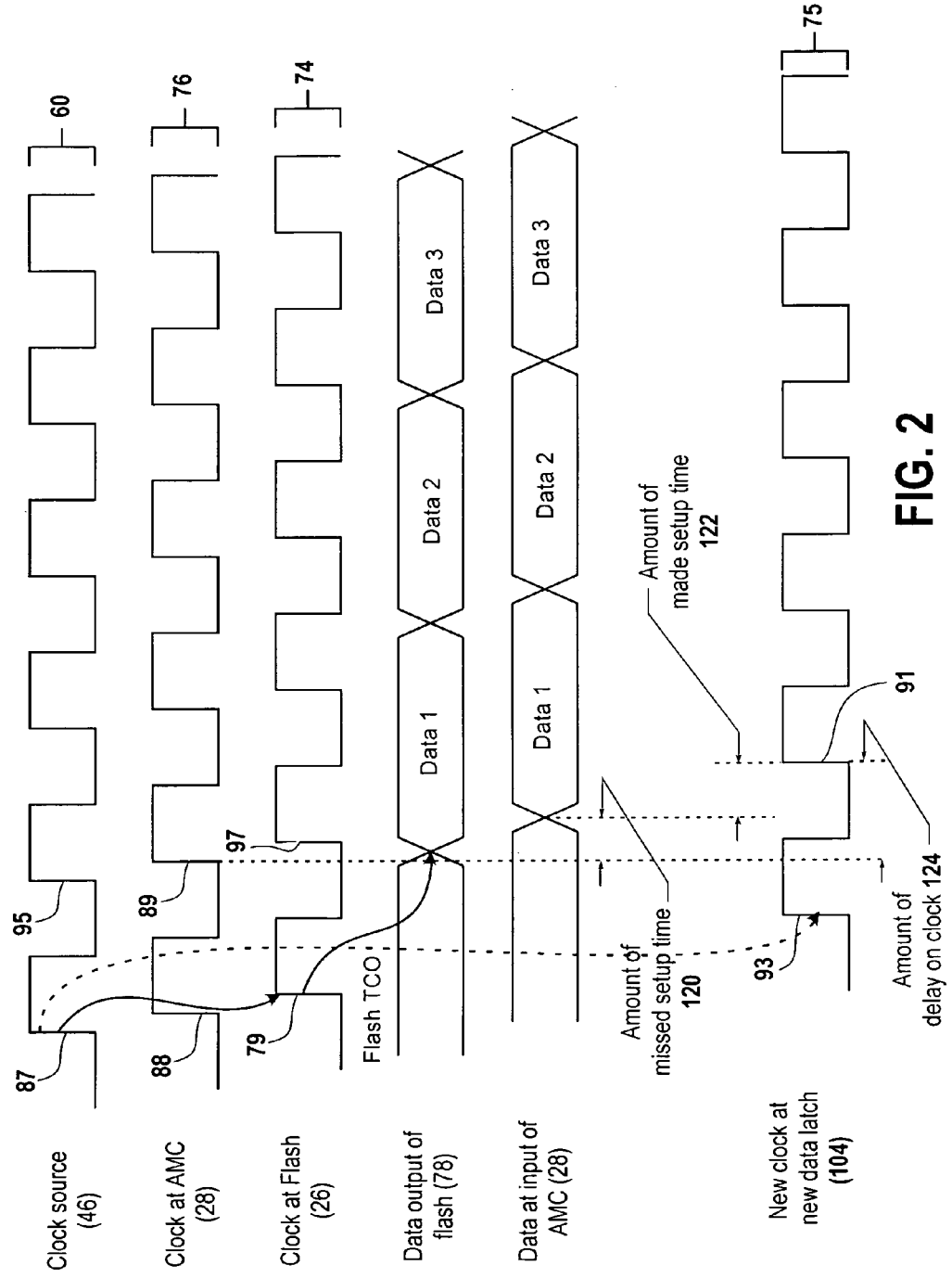
FIG. 2 is a timing diagram for the system shown in FIG. 1 and further illustrating a delayed waveform for the system illustrated in FIGS. 3 and 5 in accordance with two embodiments of the invention.

Referring to both FIGS. 1 and 2, clock source 24 generates a clock signal 60 at output 46. Signal 60 includes low and high logic levels with rising and falling edges extending therebetween. In one embodiment, the rising edges of clock signal 60 defines a trigger point for capturing and launching data. The clock signal generated by clock source 24 is present at clock input 26 of storage device 14 and is illustrated as waveform 74 of FIG. 2. The clock signal is also transmitted to AMC 20 and is present at clock input 28 as illustrated by waveform 76. The system is configured so that storage device 14 launches data, from data output 78, onto a data path in response to edge 79 being present at input 26. The data output is captured by AMC 20 at data input 40 in response to the capture edge 88 of the clock signal being sensed at clock input 28. Upon receipt of configuration data, AMC 20 interprets the data and operates to program array 16 to provide the desired logic, i.e., configure the FPGA.

Referring to FIG. 2, due to the delay between rising edge 79 of the clock input of the storage device and the data being output from the storage device, i.e., the time for clock output (TCO), along with any delay for the data to be available at the input of AMC 20, i.e., a delay between edges 87 and 79, the rising edge 88 of the waveform may trigger prior to the data, i.e., Data 1, being available at the input of AMC 20. Thus, data 1 is missed by capture edge 89 as illustrated in the top portion of FIG. 2.

Figure 3:
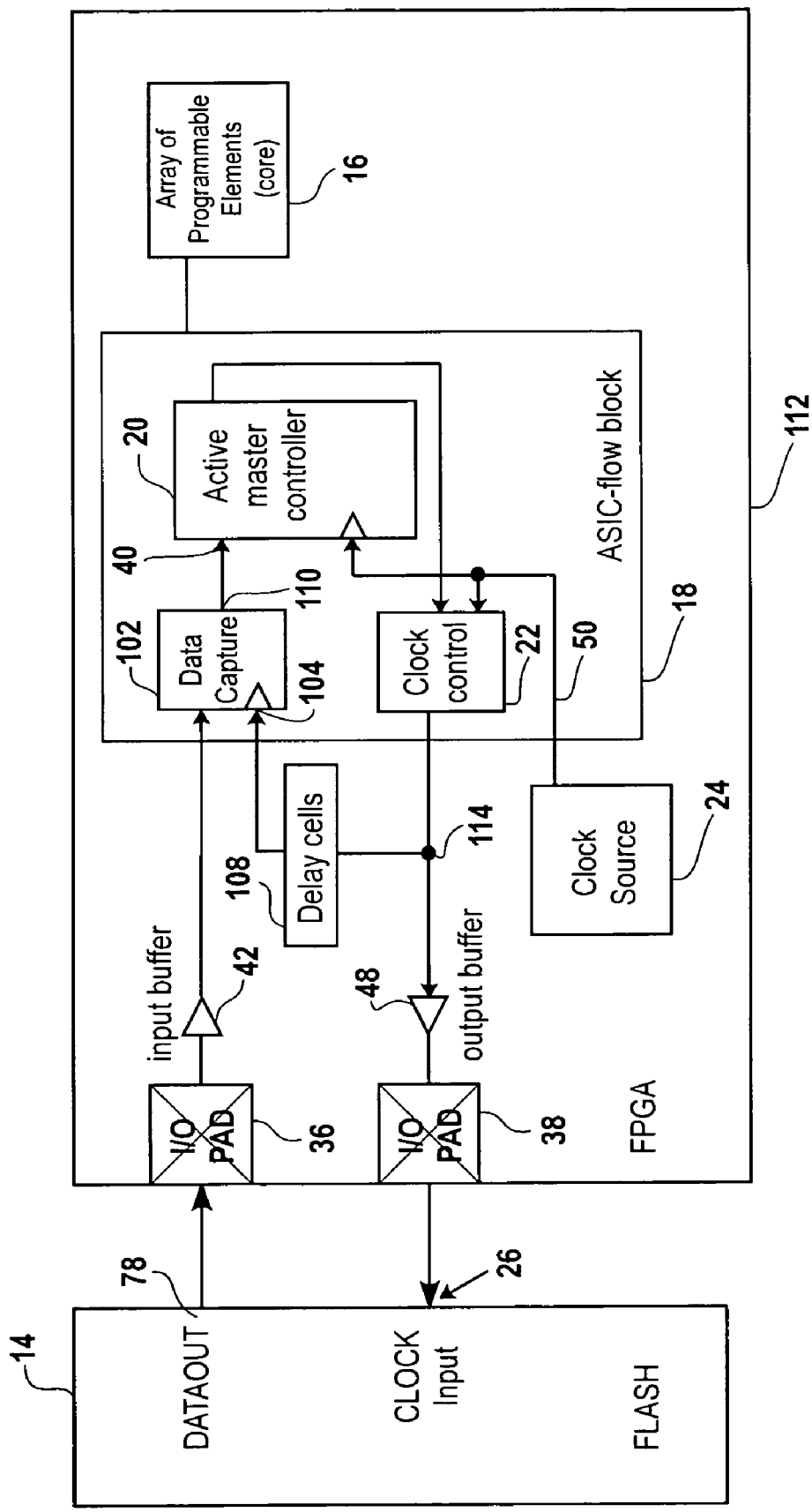
FIG. 3 is a simplified schematic diagram of a programmable logic device having delay cells in order to more efficiently clock in the configuration from an external memory region in accordance with one embodiment of the invention.

FIG. 3 is a simplified schematic diagram of a programmable logic device having delay cells in order to more efficiently clock in the configuration from an external memory region in accordance with one embodiment of the invention. Programmable logic device 112 includes clock source 24, control circuitry 18, array of programmable elements 16, delay cells 108, I/O pads 36 and 38, input buffer 42 and output buffer 48. As mentioned above, clock source 24 generates a clock signal that is transmitted to CCC 22 and AMC 20. CCC 22 further propagates the clock signal to storage device 14. Control circuitry 18 includes data latch 102, which functions to capture data, e.g., configuration data, output from storage device 14. Data latch 102 captures the data according to a clock signal provided through CCC 22 and delay cells 108. Array of programmable elements 16 includes the programmable logic of the FPGA, such as logical array blocks (LABs) of the core of the integrated circuit, etc. It should be noted that the different delays for the clock signal and capturing the configuration data may be broken down as follows: 1) a delay associated with a delay from node 114 to clock input 26, 2) a delay from clock input 26 through storage device 14 to data latch 102, and 3) a delay from node 114 through delay circuitry 106 to input 104 of latch 102. The delay from node 114 to data latch 102 is relatively small as compared to the delay from clock input 26 to data latch 102, due to the proximity of node 114 to data latch 102 and the fact that this signal pathway does not proceed through storage device 14.

As mentioned above and as illustrated with reference to FIG. 2, a set up time may not be met, thereby resulting in corrupt data in certain instances. Thus, delay circuitry 108 is provided so that data from storage device 14 is ready prior to the capture edge of the clock signal to data latch 102. Waveform 75 of FIG. 2 illustrates the waveform with the impact of delay circuitry 108 of FIG. 3. As illustrated in FIG. 2, an amount of delay imposed by the delay cells is represented by time period 124. This delay is composed of an amount of missed set up time 120 and an amount of made set up time 122. The amount of missed set up time 120 is a time difference between capture edge 89 transitioning and the arrival of valid data for data 1 at input 28 of AMC 20. The amount of made set up time is represented as the difference between the arrival of valid data for data 1 at input 28 of AMC 20 and the transitioning of capture edge 91 of waveform 75. Thus, the embodiments compensate for the large difference in delay due to the nature of the time for clock out (TCO) for the storage device by increasing a delay from a clock source to the clock input 28 of AMC 20 as illustrated by comparing waveforms 75 and 76.

This increase in delay is illustrated further in FIG. 2 by comparing the delay from capture edge 95 to capture edge 89, without the delay cells (waveforms 60 and 76) and the delay from capture edge 95 to capture edge 91 with the delay cells (waveforms 60 and 75). It should be noted that this increase is represented as time period 124. Accordingly, the smallest possible FPGA configuration clock period is the amount of time it takes to receive data from the storage device, i.e., the delay from capture edge 95 to capture edge 97 plus the delay from the TCO as wells as the delay from providing the data to the input of the AMC, minus the delay from the delay circuitry, i.e., time period 124, which includes time borrowed from the next cycle. Thus, through these embodiments a faster configuration speed is provided, as the minimum time period is capable of being further reduced. It should be appreciated that edges 87, 88, 79, and 93 may be referred to as launch edges, while edges 95, 89, 97, and 91 may be referred to as capture edges. However, this is not meant to be limiting as one skilled in the art will appreciate that the devices described herein may launch and capture data contemporaneously.

Figure 4:
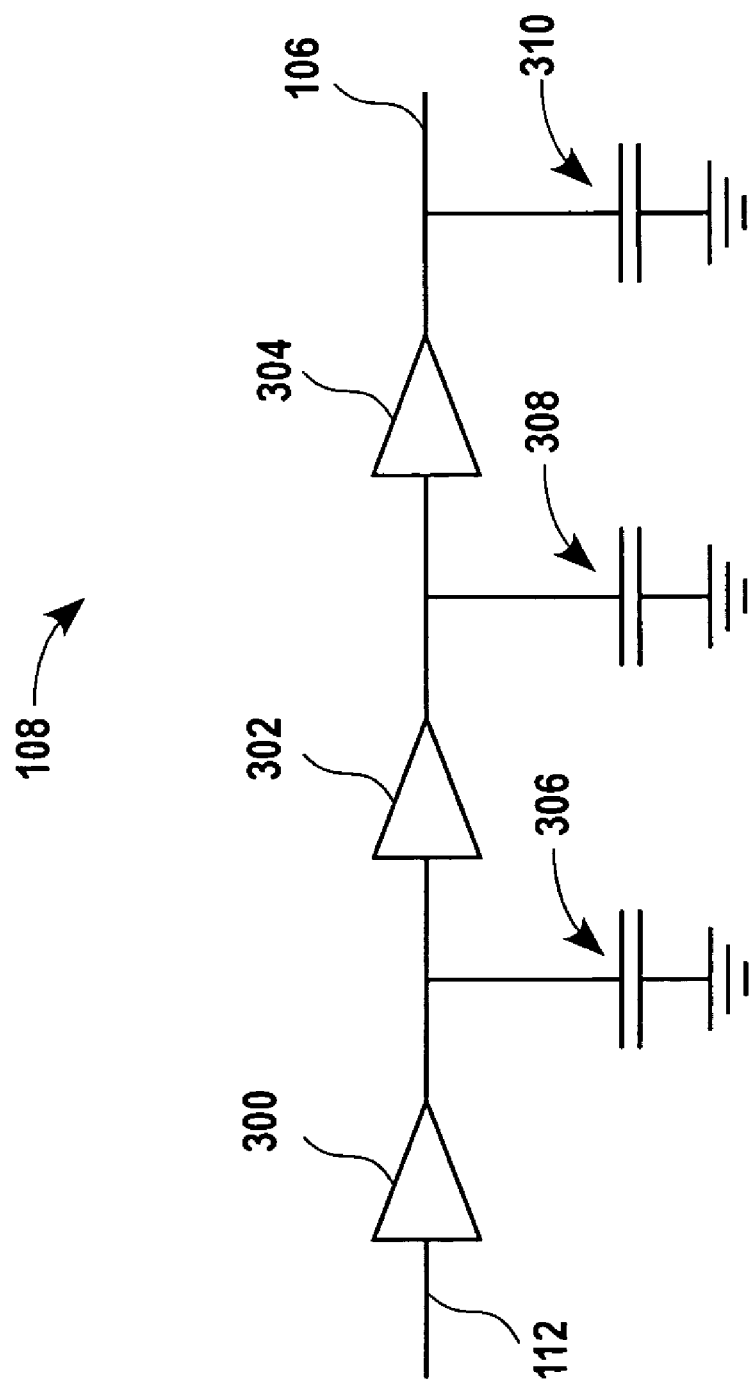
FIG. 4 is a simplified schematic of the delay circuit shown in accordance with one embodiment of the present invention.

FIG. 4 is a simplified schematic diagram of the components of the delay circuit in accordance with one embodiment of the invention. It should be appreciated that delay circuitry 108 may be any known circuit that can implement the desired delay and is not limited to the exemplary circuit of FIG. 4. In one embodiment, delay circuitry 108 is a series of buffers 300, 302 and 304 connected in series, with a capacitor 306, 308 and 310 connected between ground and one output thereof. An input of buffer 300 receives an input, e.g., from node 114 of FIG. 3, and an output of buffer 304 defines an output 106 that may be transmitted to data latch 102. An output of buffer 300 is connected to an input of buffer 302, with an output of buffer 302 being connected to an input of buffer 304. Capacitors 306, 308, and 310 are connected to the outputs buffers 300, 302, and 304, respectively.

Figure 5:
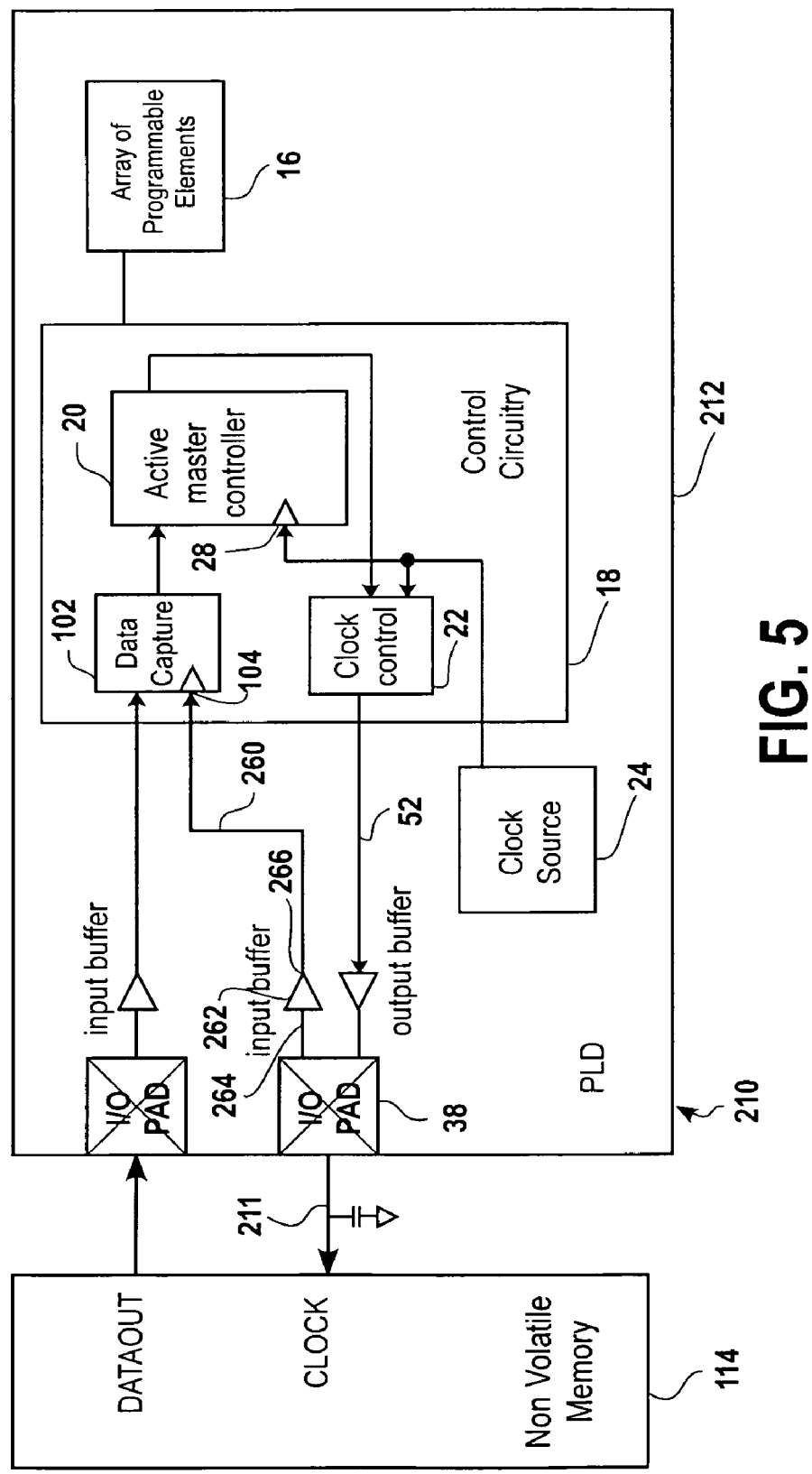
FIG. 5 is a simplified schematic view of a system for transmitting data to a configurable integrated circuit in accordance with an alternate embodiment of the present invention.

FIG. 5 is a simplified schematic diagram illustrating an alternate embodiment for the delay circuitry in accordance with one embodiment of the invention. Integrated circuit 212 is included in system 210, with the understanding that integrated circuit 212 is identical to integrated circuit excepting that delay circuitry 108 has been replaced with delay circuitry that includes a return clock path having signal trace 260, and a buffer 262 having an input trace 264 and an output 266. Thus, in FIG. 5, the return path for the clock signal to data latch 102 commences at output pad 38 and terminates at input 104 of data latch 102. The return path includes the delay, e.g., time period 124 of FIG. 2, as discussed above by virtue of the delay presented to clock signal 60 propagating along the return path to input 104 of data latch 102. It should be appreciated that additional buffers 262 may be incorporated to accommodate different delay times and the illustration of FIG. 5 is exemplary and not meant to be limiting. In one embodiment, the delay circuitry of FIGS. 3 and 4 is incorporated along the return path from I/O pad 38 to latch 102. One skilled in the art will appreciate that the embodiment of FIG. 5 takes advantage of the relatively large capacitance of trace 211 and may be considered self tuning.

In summary, a technique for more efficiently providing a configuration into a synchronous design of a programmable logic device is provided. The same clock signal output to an external storage device is delayed to the storage elements that capture the returning data. Through the embodiments a compensated clocking scheme is provided for configuration of programmable logic devices by embedding delay cells that allow the same clock edge to both clock the flash for data and clock the configuration data from the flash into a configuration register, e.g., a latch. It should be noted that as long as the added delay is less than the amount of time it takes at the capture storage elements, the method essentially borrows time from a next cycle as illustrated with reference to FIG. 2. Accordingly, the PLD configuration clock period is the amount of time it takes to receive data from the external storage device, e.g., flash memory, minus the time borrowed from the next cycle.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

As used herein programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package. In one embodiment, the technique described herein may be applied to the different families of programmable logic devices owned by the assignee.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for transmitting data to an integrated circuit, comprising:
   transmitting a clock signal, to an external storage device and a data latch of the integrated circuit, the storage device containing configuration data to configure the integrated circuit, the clock signal transmitted through a clock control circuit to both the external storage device and the data latch;
   launching the configuration data from the storage device to the integrated circuit in response to the storage device sensing a launch edge of the clock signal; and
   delaying the clock signal to the data latch for a predetermined time, with the predetermined time being sufficient to compensate for a delay between transmitting the clock signal and launching the configuration data to ensure the configuration data is captured by the data latch thereby reducing a clock period for transferring the configuration data.

2. The method as recited in claim 1 wherein the predetermined time is less than a minimum time during which the data propagates between the data storage device and the data latch.

3. The method as recited in claim 1 wherein the integrated circuit utilizes a synchronous clock signal generated by the integrated circuit.

4. The method as recited in claim 1 wherein transmitting further includes propagating the clock signal along a clock path extending between a clock source and a clock output pad and delaying further includes having the data latch sense the clock signal from a region of the clock path located between the clock output pad and the clock source.

5. The method as recited in claim 1 wherein transmitting further includes propagating the clock signal along a clock path extending between a clock source and a clock output pad and delaying further includes having the data latch sense the clock signal from a region of the clock path located between the clock output pad and the clock source after propagating the clock signal through a delay circuit, wherein a delay through the delay circuit establishes the predetermined time.

6. The method as recited in claim 1 wherein the delaying includes propagating the clock signal through multiple buffers connected in series.

7. The method as recited in claim 1 wherein the integrated circuit is a programmable logic device and the data is configuration data for the programmable logic device.

8. A system for transmitting data to a configurable integrated circuit having a synchronous design, the system comprising:

a storage device containing data;

an integrated circuit in communication with the storage device containing data, the integrated circuit including a clock source to generate a clock signal for transmission to clock control circuitry and a master controller, the clock control circuitry distributing the clock signal to the storage device and delay circuitry, wherein the delay circuitry establishes a predetermined delay between a launch edge being sensed by the storage device and a capture edge being sensed by a data latch capturing data from the storage device to compensate for a delay between transmitting the launch edge and sensing of the launch edge at the storage device to ensure the data arrives at the data latch prior to the capture edge.

9. The system as recited in claim 8 wherein the delay circuitry includes a series of buffers.

10. The system as recited in 9 wherein a capacitor is connected to an output of each of the buffers.

11. The system as recited in claim 8 wherein the clock signal is delivered to the storage device and the delay circuitry through an output pad of the integrated circuit.

12. The system as recited in claim 8 wherein the integrated circuit is a programmable logic device and wherein the data is configuration data for the programmable logic device.

13. The system as recited in claim 8 wherein the latch provides the data to the master controller, the master controller receiving the clock signal and programming logic elements within the integrated circuit according to the data.

14. A system for transmitting data to a configurable integrated circuit synchronously, comprising:

an integrated circuit including an array of programmable elements, control circuitry in electrical communication with the array, a data latch in electrical communication with a storage device to receive configuration data from the storage device; a clock source for transmitting a clock signal to the storage device and the data latch through the control circuitry, the integrated circuit including delay circuitry in communication with the clock source and the data latch, wherein the storage device launches the configuration data in response to sensing a launch edge of the clock signal received through the control circuitry, and wherein the delay circuitry establishes a predetermined delay between the launch edge being sensed by the storage device and the capture edge being sensed by the data latch to compensate for a delay between transmitting the launch edge and sensing of the launch edge at the storage device to ensure the configuration data arrives at the data latch prior to the capture edge.

15. The system as recited in claim 14 wherein the storage device includes a clock input in electrical communication with an output pad of the integrated circuit, the integrated circuit further including a clock path in electrical communication with the output pad, and wherein the clock source transmits the clock signal along the clock path, with the delay circuitry connected to a node of the clock path located between the output pad and the clock source, with an output of the delay circuitry being coupled to a clock input of the data latch.

16. The system as recited in claim 14 wherein the clock signal is delivered to the storage device and the delay circuitry through an output pad of the integrated circuit.

17. The system as recited in claim 14 wherein the delay circuitry is a series of input buffers.

18. The system as recited in claim 17 wherein an output of each of the series of input buffers is connected to a capacitor.

19. The system as recited in claim 14 wherein the storage device is non-volatile memory that is external to the integrated circuit and wherein the integrated circuit is a programmable logic device.

20. The system as recited in claim 14 wherein a same clock edge is used to clock the storage device and to clock the configuration data into the data latch.

\* \* \* \* \*